(12) United States Patent
Wang et al.

(10) Patent No.: US 9,406,740 B2
(45) Date of Patent: Aug. 2, 2016

(54) SILICON PROCESS COMPATIBLE TRENCH MAGNETIC DEVICE

(71) Applicant: International Business Machines Corporation, Armonk, NY (US)

(72) Inventors: Naigang Wang, Ossining, NY (US); Bucknell C. Webb, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/745,703

(22) Filed: Jun. 22, 2015

(65) Prior Publication Data
US 2015/0287772 A1 Oct. 8, 2015

Related U.S. Application Data

(62) Division of application No. 14/200,503, filed on Mar. 7, 2014, now Pat. No. 9,159,778.

(51) Int. Cl.
| | |
|---|---|
| *H01L 21/31* | (2006.01) |
| *H01L 49/02* | (2006.01) |
| *H01L 21/768* | (2006.01) |
| *H01L 23/522* | (2006.01) |
| *H01L 21/311* | (2006.01) |
| *H01L 21/3205* | (2006.01) |

(52) U.S. Cl.
CPC ............... *H01L 28/10* (2013.01); *H01L 21/31* (2013.01); *H01L 21/31111* (2013.01); *H01L 21/3205* (2013.01); *H01L 21/76898* (2013.01); *H01L 23/5226* (2013.01); *H01L 23/5227* (2013.01); *H01L 2924/0002* (2013.01)

(58) Field of Classification Search
USPC ........................................................... 438/3
See application file for complete search history.

(56) References Cited

U.S. PATENT DOCUMENTS

| | | | |
|---|---|---|---|
| 5,793,272 | A | 8/1998 | Burghartz et al. |
| 5,801,521 | A | 9/1998 | Mizoguchi et al. |
| 6,417,754 | B1 | 7/2002 | Bernhardt et al. |

(Continued)

FOREIGN PATENT DOCUMENTS

| | | |
|---|---|---|
| JP | 08172015 A | 7/1996 |
| JP | 2001143929 | 5/2001 |

OTHER PUBLICATIONS

Naigang Wang, et al.; "Silicon Process Compatible Trench Magnetic Device"; U.S Appl. No. 14/745,713, filed Jun. 22, 2015.

*Primary Examiner* — Asok K Sarkar
(74) *Attorney, Agent, or Firm* — Cantor Colburn LLP; Louis Percello

(57) ABSTRACT

A mechanism is provided for integrating an inductor into a semiconductor. A circular or other closed loop trench is formed in a substrate with sidewalls connected by a bottom surface in the substrate. A first insulator layer is deposited on the sidewalls of the trench so as to coat the sidewalls and the bottom surface. A conductor layer is deposited on the sidewalls and the bottom surface of the trench so as to coat the first insulator layer in the trench such that the conductor layer is on top of the first insulator layer in the trench. A first magnetic layer is deposited on the sidewalls and bottom surface of the trench so as to coat the first insulator layer in the trench without filling the trench. The first magnetic layer deposited on the sidewalls forms an inner closed magnetic loop and an outer closed magnetic loop within the trench.

5 Claims, 13 Drawing Sheets

(56) References Cited

U.S. PATENT DOCUMENTS

| | | | |
|---|---|---|---|
| 6,940,147 B2 * | 9/2005 | Crawford | H01F 17/0006 257/528 |
| 7,078,784 B2 | 7/2006 | Davies | |
| 7,170,173 B2 | 1/2007 | Leuschner et al. | |
| 7,288,417 B2 | 10/2007 | Ding et al. | |
| 7,791,440 B2 | 9/2010 | Ramadan et al. | |
| 7,829,427 B2 | 11/2010 | Edelstein et al. | |
| 7,973,630 B2 | 7/2011 | Masai et al. | |
| 8,072,042 B1 | 12/2011 | Kroener | |
| 8,324,692 B2 | 12/2012 | Chen et al. | |
| 9,159,778 B2 | 10/2015 | Wang et al. | |
| 2003/0005572 A1 * | 1/2003 | Gardner | H01F 17/0006 29/602.1 |
| 2012/0009689 A1 | 1/2012 | Smeys et al. | |
| 2013/0093032 A1 * | 4/2013 | Webb | H01L 23/645 257/421 |
| 2014/0159196 A1 * | 6/2014 | Mackh | H01L 21/76898 257/531 |
| 2014/0176292 A1 * | 6/2014 | Ortiz | H01F 27/362 336/84 C |
| 2014/0240074 A1 * | 8/2014 | Qui | H01F 41/02 336/211 |

* cited by examiner

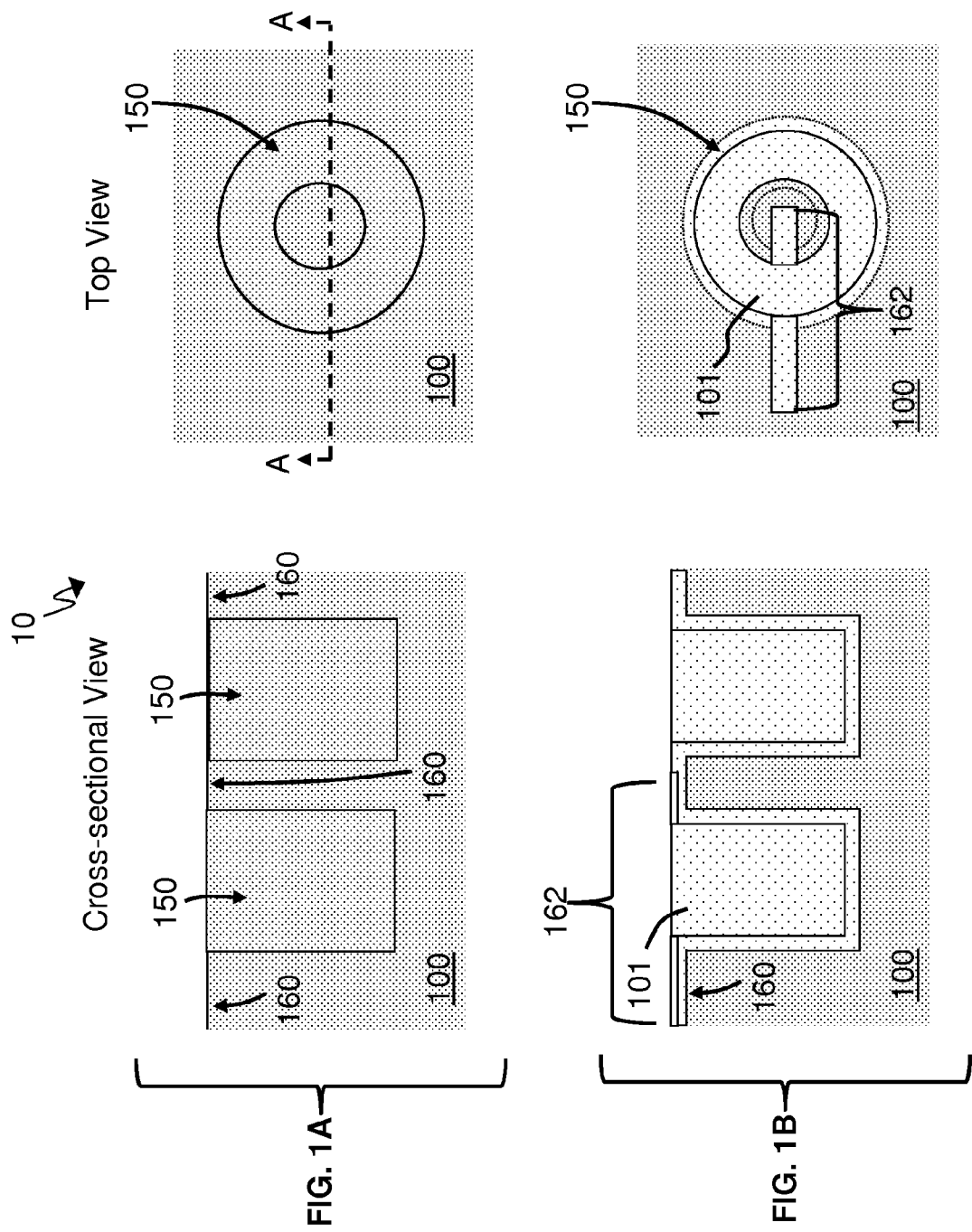

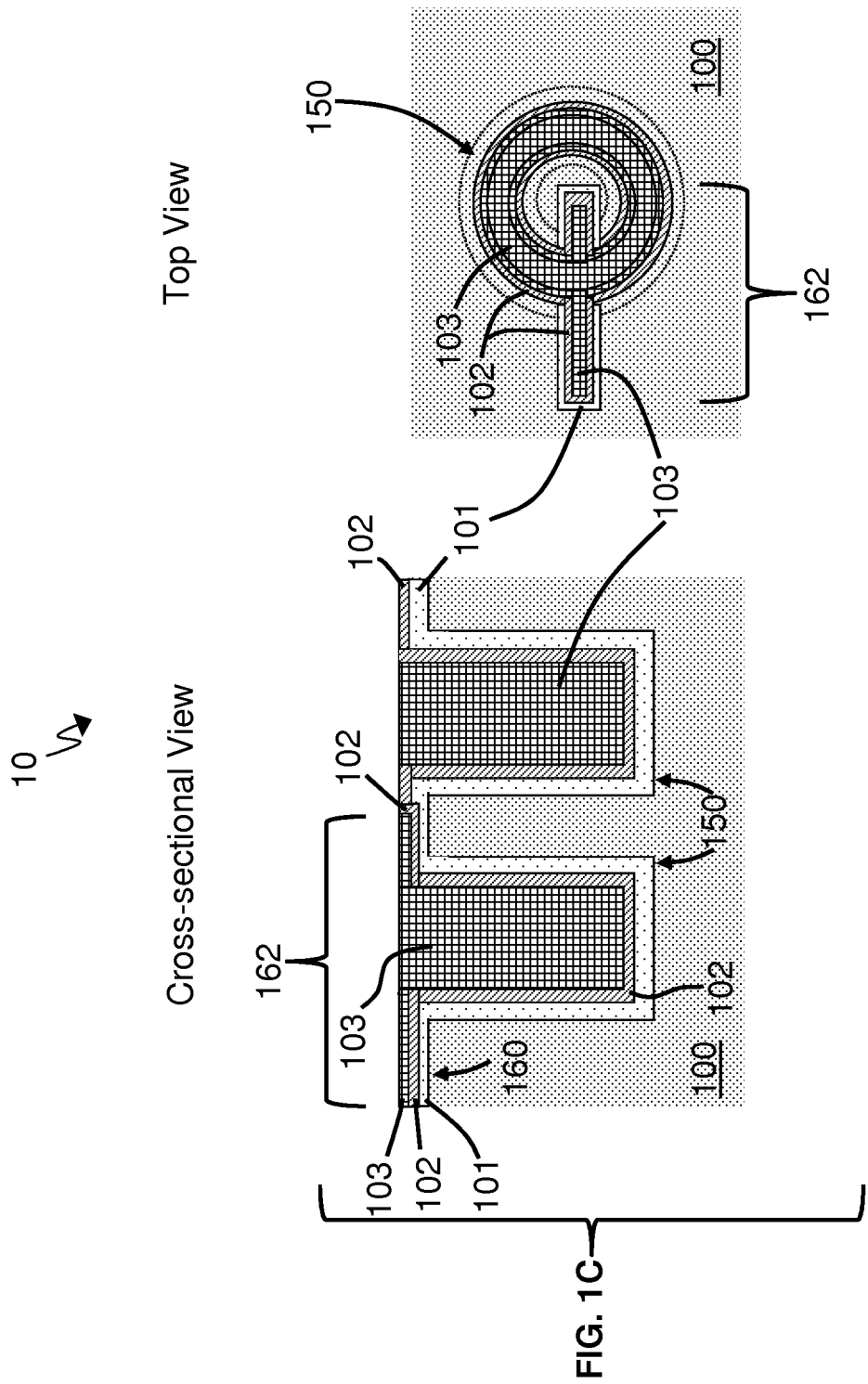

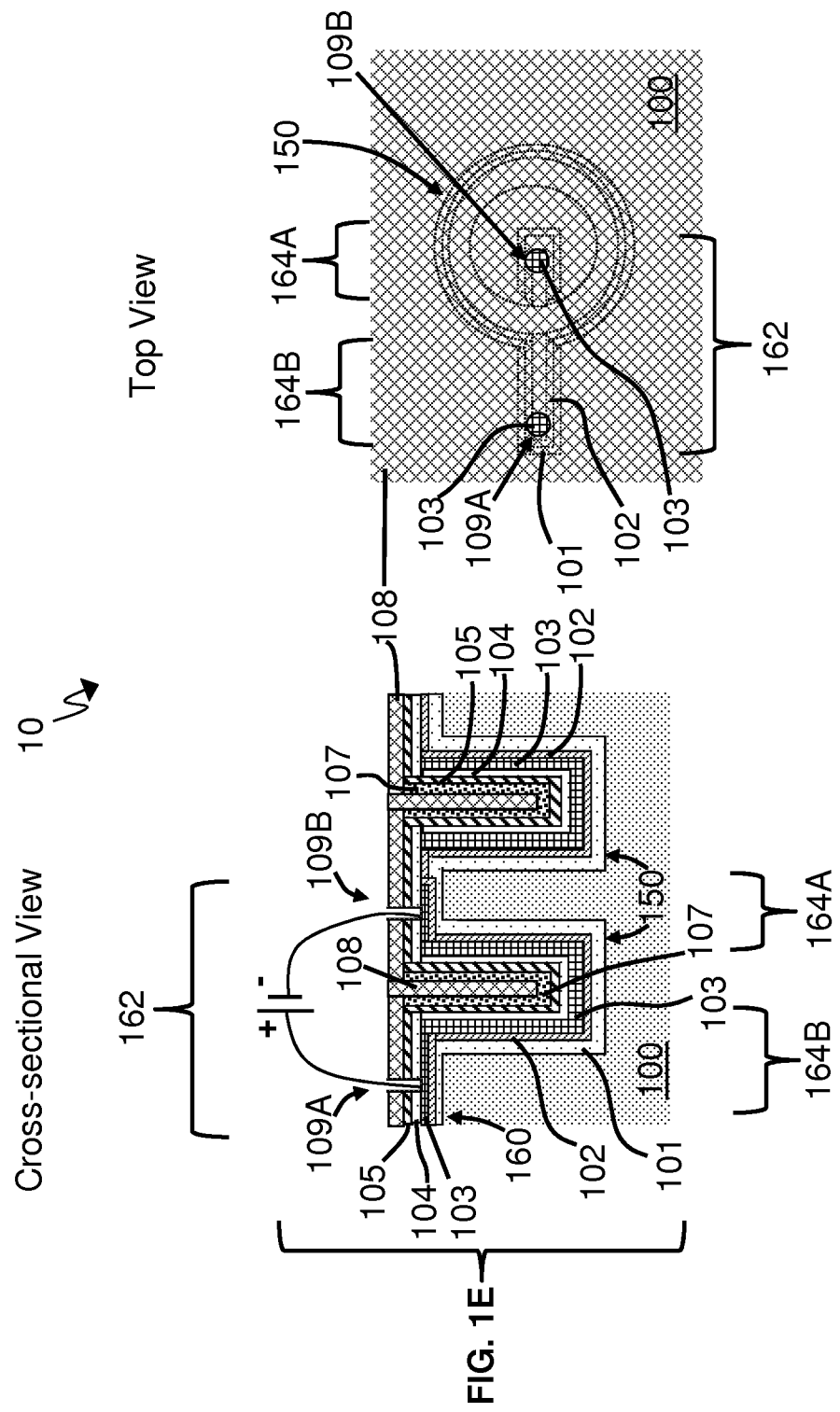

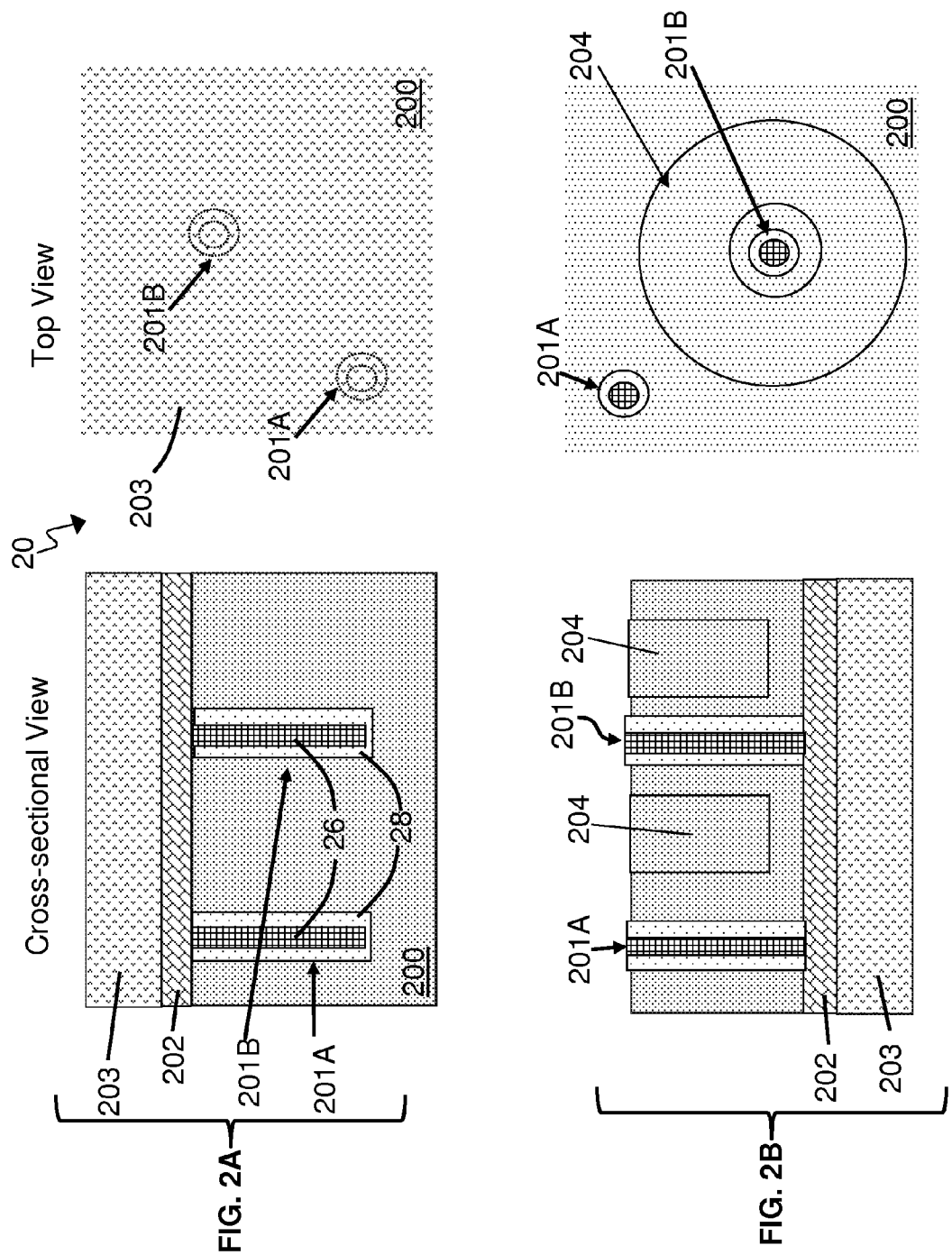

The conductor layer deposited on the sidewalls forms an inner closed loop and an outer closed loop within the trench connected by a bottom conductor layer on the bottom surface of the trench, in which the inner closed loop, the outer closed loop, and the bottom conductor layer form an interior conductor path inside the trench, such that the interior conductor path passes underneath and around sides of the magnetic material in the trench 330

↓

The interior conductor path inside the trench connects to an exterior conductor path, the exterior conductor path separately connects to the inner loop of the conductor layer and the outer loop of the conductor layer 335

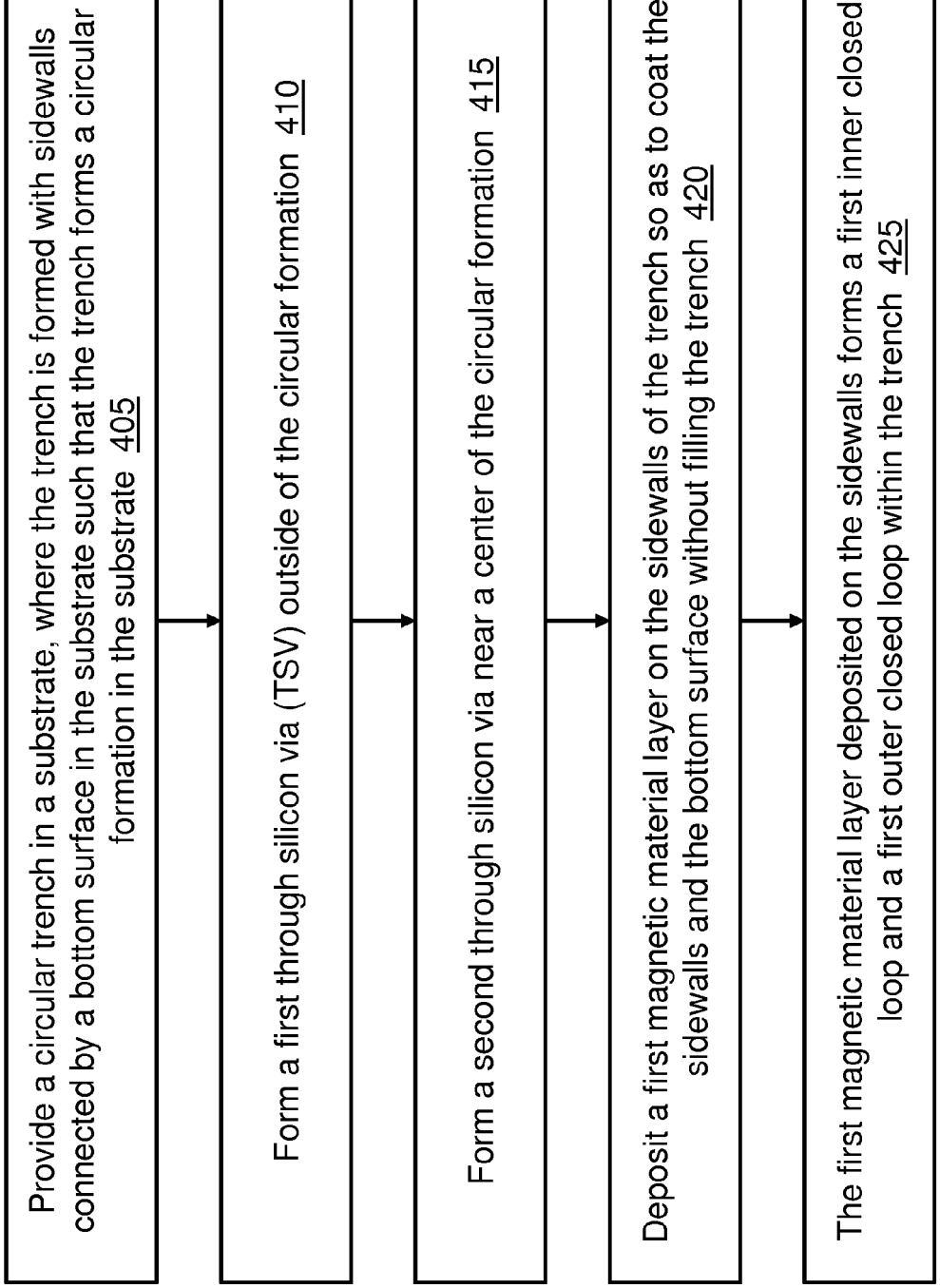

SILICON PROCESS COMPATIBLE TRENCH MAGNETIC DEVICE

DOMESTIC PRIORITY

This application claims priority to U.S. application Ser. No. 14/200,503, filed Mar. 7, 2014, which is incorporated herein by reference in its entirety.

BACKGROUND

The present invention relates generally to semiconductor integrated magnetic devices, and more specifically, to a toroidal trench inductor.

When constructing a semiconductor integrated magnetic device using a magnetic film, it is desirable to make the magnetic film sufficiently thick to obtain desirable operating characteristics for a given frequency of operation. However, the thickness of a single magnetic layer that is required for a given operating frequency of the magnetic device may result in the build-up of eddy currents in the magnetic material during operation, thereby resulting in some loss. As such, the magnetic film is typically made sufficiently thin to avoid eddy current losses, but with the tradeoff of lower energy storage ability.

The energy storage of an integrated magnetic device can be increased, however, by building a magnetic structure using a stack of alternating thin magnetic and insulating films, wherein the magnetic layers are separated by a thin insulating layer. In general, the use of multiple layers of magnetic material separated by layers of insulating material serves to prevent the build-up of eddy currents in the magnetic material, while providing an effective thickness of magnetic material, which is sufficient to obtain the desired operating characteristics for a given frequency of operation.

Conventional techniques for building multilayer magnetic-insulator structures include sputtering techniques. In general, a sputtering process includes forming a multilayer stack by alternately sputtering layers of a magnetic material and a dielectric material, patterning a photoresist layer to form an etch mask, using the etch mask to etch the multilayer stack of magnetic-insulating layers and remove unwanted regions of the multilayer stack, and then removing the etch mask. While sputtering can be used to build stacks of magnetic-insulating layers, the material and manufacturing costs for sputtering are high.

BRIEF SUMMARY

According to an exemplary embodiment, a method of integrating an inductor into a semiconductor is provided. The method includes providing a circular or other closed loop trench in a substrate, in which the trench is formed with sidewalls connected by a bottom surface in the substrate. The method includes depositing a first insulator layer on the sidewalls of the trench so as to coat the sidewalls and the bottom surface, and depositing a conductor layer on the sidewalls and the bottom surface of the trench so as to coat the first insulator layer in the trench such that the conductor layer is on top of the first insulator layer in the trench. A first magnetic layer is deposited on the sidewalls and the bottom surface of the trench so as to coat the first insulator layer in the trench without filling the trench. The first magnetic layer deposited on the sidewalls forms an inner closed magnetic loop and an outer closed magnetic loop within the trench. An interior conductor path is formed by the conductor layer at an inside wall of the trench, such that the interior conductor path connects to a first exterior conductor connection. A second exterior conductor connection separately connects to the conductor layer formed on an outside wall of the trench. An electrical path from the first exterior conductor connection to the second exterior conductor connection by way of the conductor layer in the trench forms a continuous electrical path that passes through the inner and outer closed magnetic loops.

According to another exemplary embodiment, an integrated inductor in a semiconductor is provided. The integrated inductor includes a circular or other closed loop trench in a substrate, in which the trench is formed with sidewalls connected by a bottom surface in the substrate. A first insulator layer is deposited on the sidewalls of the trench so as to coat the sidewalls and the bottom surface. A conductor layer is deposited on the sidewalls and bottom surface of the trench so as to coat the first insulator layer in the trench such that the conductor layer is on top of the first insulator layer in the trench. A second insulator layer is deposited on top of the conductor layer on the sidewalls and the bottom surface of the trench. A first magnetic layer is deposited on the sidewalls and the bottom surface of the trench so as to coat the second insulator layer in the trench without filling the trench. The first magnetic layer deposited on the sidewalls forms an inner closed magnetic loop and an outer closed magnetic loop within the trench. An interior conductor path is formed by the conductor layer at an inside wall of the trench, such that the interior conductor path connects to a first exterior conductor connection. A second exterior conductor connection separately connects to the conductor layer formed on an outside wall of the trench. An electrical path from the first exterior connection to the second exterior connection by way of the conductor layer in the trench forms a continuous electrical path that passes through the inner and outer closed magnetic loops.

According to another exemplary embodiment, a method of integrating an inductor into a semiconductor is provided. The method includes providing a circular or other closed loop trench in a substrate, in which the trench is formed with sidewalls connected by a bottom surface in the substrate such that the trench forms a closed loop formation in the substrate. The method includes forming a first through silicon via (TSV) outside of the closed loop formation, forming a second through silicon via near a center of the closed loop formation, and depositing a first magnetic material layer on the sidewalls of the trench so as to coat the sidewalls and the bottom surface without filling the trench. The first magnetic material layer deposited on the sidewalls forms a first inner closed magnetic loop and a first outer closed magnetic loop within the trench. An electrical connection is formed between the first and second through silicon via, so as to define a continuous electrical path that passes from the first through silicon via to the second through silicon via and passes through the inner and outer closed magnetic loops.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A through 1E illustrate a fabrication process to form an embedded toroidal trench inductor structure according to an embodiment, in which:

FIG. 1A illustrates a cross-sectional view and its corresponding top view of fabricating the toroidal trench inductor structure according to an embodiment.

FIG. 1B illustrates a cross-sectional view and its corresponding top view of fabricating the toroidal trench inductor structure according to an embodiment.

FIG. 1C illustrates a cross-sectional view and its corresponding top view of fabricating the toroidal trench inductor structure according to an embodiment.

FIG. 1D illustrates a cross-sectional view and its corresponding top view of fabricating the toroidal trench inductor structure according to an embodiment.

FIG. 1E illustrates a cross-sectional view and its corresponding top view of fabricating the toroidal trench inductor structure according to an embodiment.

FIGS. 2A through 2F illustrate a fabrication process to form an embedded toroidal trench inductor structure according to an embodiment, in which:

FIG. 2A illustrates a cross-sectional view and its corresponding top view of fabricating the toroidal trench inductor structure according to an embodiment.

FIG. 2B illustrates a cross-sectional view and its corresponding top view of fabricating the toroidal trench inductor structure according to an embodiment.

FIG. 2C illustrates a cross-sectional view and its corresponding top view of fabricating the toroidal trench inductor structure according to an embodiment.

FIG. 2D illustrates a cross-sectional view and its corresponding top view of fabricating the toroidal trench inductor structure according to an embodiment.

FIG. 2E illustrates a cross-sectional view and its corresponding top view of fabricating the toroidal trench inductor structure according to an embodiment.

FIG. 2F illustrates an optional process that continues from FIG. 2C according to an embodiment.

FIGS. 3A and 3B together illustrate a method of integrating an inductor into a semiconductor such as the substrate according to an embodiment.

FIG. 4 illustrates a method of integrating an inductor into a semiconductor according to an embodiment.

DETAILED DESCRIPTION

Figure 1D:
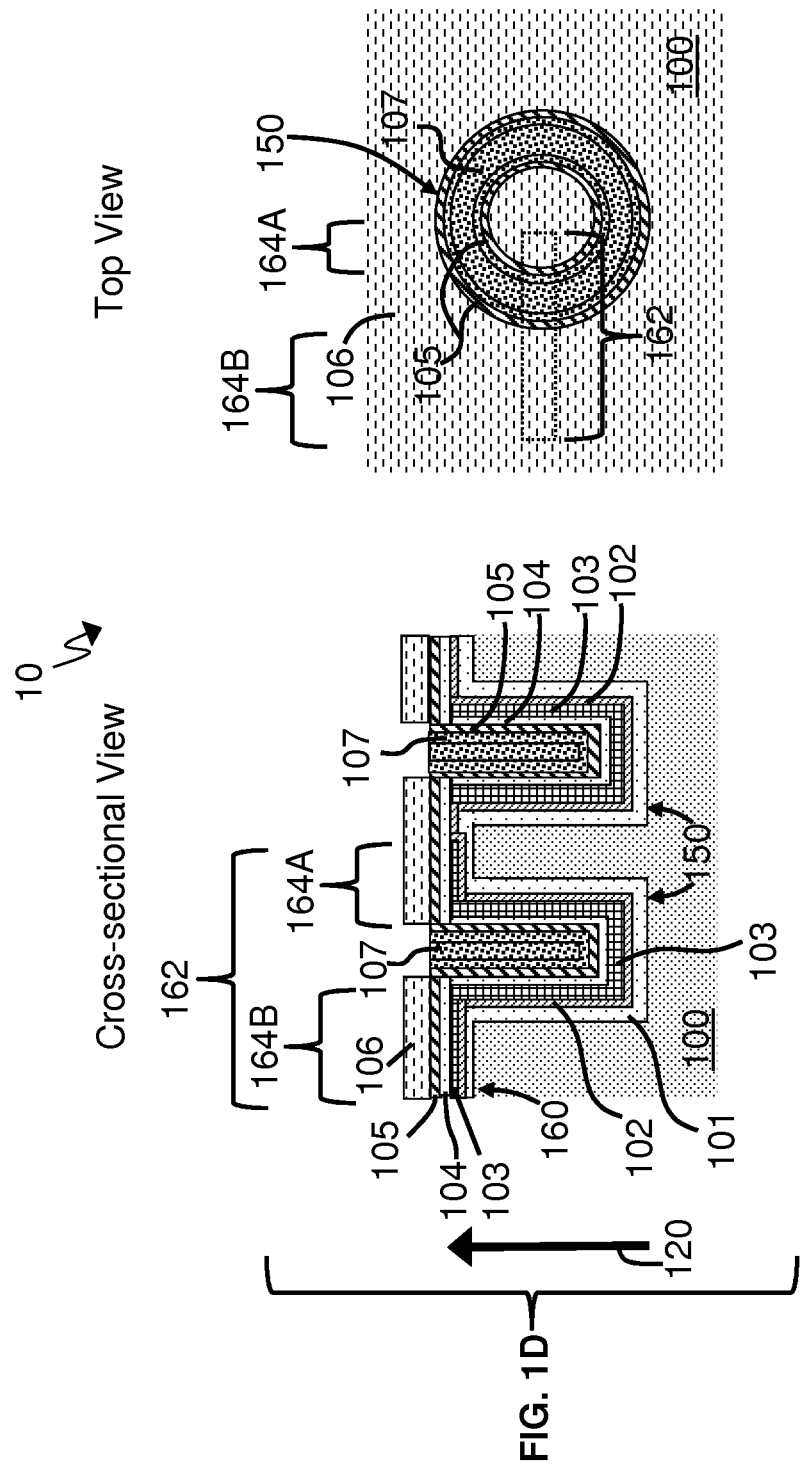

For high frequency integrated inductors, one needs a closed loop of magnetic material and a coil that passes through the closed loop. According to embodiments, examples are provided of a toroidal ring of magnetic material embedded flat in the substrate with a coil around the magnetic material.

In the present disclosure, this is done by making a circular or other closed loop trench and depositing magnetic material on the walls of the trench. There are two closed loops of magnetic material made at once: the interior and exterior walls. So instead of depositing twice to achieve one closed magnetic loop, the process herein deposits once and makes two closed loops of magnetic material. If there is more than one concentric trench loop, the result is that the process makes two more layers of magnetic material for each additional trench. This means one can get many (for multiple concentric loops) thin layers of magnetic material in one deposition step. The advantage of many thin magnetic layers is that the eddy current losses in the magnetic film are determined by the thickness of a film, while the overall inductance and magnetic saturation current increase with the amount of magnetic material. The ring trench approach allows for a high inductance in a small substrate surface area. It is noted that the trench should not be filled with conducting magnetic material as this shorts the interior and exterior walls of the magnetic layers together.

The coil (i.e., conductor material such as copper) has to pass through these loops of magnetic material. There are two ways to accomplish this:

1. Depositing conductor (usually copper) on the side walls and bottom of the trench so that there is path down the side of the trench, across the bottom and up the interior wall. This is like wrapping a very wide flat wire through the torroid.

2. Create separately silicon through visa (TSVs) by techniques understood by one skilled in the art and have one inside the magnetic loop and one outside, and then connect the two at the wafer back surface. Note that embodiments may use more TSVs and/or may use more copper layers with insulation in between to create additional coils and coil turns.

In order to facilitate the use of thin film magnetic material, embodiments ensure that the magnetic easy axis is oriented perpendicular to the wafer (substrate) surface. This is accomplished by applying a magnetic field perpendicular to the substrate plane during depositions and anneals. (Conventional systems have the applied magnetic filed and induced magnetic easy axis in the plane field of the substrate.)

Embodiments deposit a thin nonmagnetic layer (examples: NiP, Ta, TaN, TiN, Cu, Ni or other metal or insulator between 5 nm (nanometers) and 1000 nm) on top of the magnetic materials on the trench walls, and the deposit a second layer of magnetic material on the trench walls. A bilayer of magnetic material with a thin nonmagnetic separator has better magnetic domain properties. If the separator is insulating, implementations achieve twice the magnetic thickness without increased eddy current loss. If the separator is insulating, implementations may deposit an additional conducting seed layer when the magnetic layer is to be electroplated.

Some implementations may have more than one coil passing through the magnetic loops done by: 1) two layers of copper on the trench walls separated by insulator; 2) copper on the trench walls and coil(s) made using TSVs and substrate surface wires; and/or 3) two or more coils made using TSVs and substrate surface wires.

Having two or more coils allows for transformer and coupled inductor applications. Also, implementations may connect the coils in series to achieve more turns and a higher inductance.

In some implementations, the magnetic materials are insulated from the substrate, and the magnetic materials are insulated from the conductor (which improves performance). Also, after the magnetic material is deposited, the trench may then be filled in with a nonmagnetic, non-conducting material such as oxide or polymer. This allows wiring on the top surface and is required if the inductor is not connected to another substrate that contains a path to close the inductor coil loop. The trench loops may be circular which provides better magnetic properties. Also, the layers of magnetic material may be deposited by electroplating: this requires deposition of a continuous conducting seed layer that is removed after the magnetic film deposition. The magnetic properties are better (fewer domain walls) if the magnetic material is continuous from the walls across the bottom of the trench.

Now turning to the figures, FIGS. 1A, 1B, 1C, 1D, and 1E (generally referred to as FIG. 1) illustrate a schematic to fabricate an embedded toroidal trench inductor structure 10 according to an embodiment. For the toroidal trench inductor structure 10, FIGS. 1A through 1E illustrate cross-sectional views on the left and corresponding top views on the right.

FIG. 1A illustrates etching a substrate 100 to eventually form two concentric closed loop rings of magnetic material in per single (circular and/or closed loop) trench 150. The substrate 100 may be silicon. Only one trench is shown but it is understood that two or more concentric (circular) trenches may be utilized as discussed herein.

FIG. 1B illustrates depositing an oxide insulator 101 in the trench 150. The sidewalls and bottom surface of the trench 150 are coated with the oxide insulator 101. The oxide insulator 101 is also deposited on the top surface 160 of the substrate. A damascene groove 162 is etched into the oxide insulator 101 to define the wiring traces for connection to the inductor at the trench interior and exterior. Other materials are also deposited in the damascene groove 162 as discussed further in FIG. 1. Note that the oxide insulator 101 is deposited so as not to fill the trench 150 but to leave a cavity in the trench. The oxide insulator 101 material may have a thickness of 50 nm (nanometers) to 1000 nm on each sidewall and a thickness of 50 nm to 1000 nm on the bottom surface.

FIG. 1C illustrates (optionally) depositing an adhesion layer/liner 102 on top of the coated oxide insulator 101 in the circular trench 150 and also on the top surface 160 of the substrate 100. Examples of the adhesion layer/liner 102 include Ti/TiN, Ta/TaN, etc. The adhesion layer/liner 102 is deposited (and patterned) on the top surface 160 of the substrate 100 in the elongated pattern wiring trace 162 so as to fit within the rectangular shape of the (previously deposited) oxide insulator 101 material. Note that the adhesion layer/liner 102 is deposited on the sidewalls and bottom surfaces of the trench 150 so as to leave a cavity in the trench 150. The adhesion layer/liner 102 may have a thickness of 10 nm to 1000 nm on each sidewall and a similar thickness on the bottom surface.

After depositing the adhesion layer/liner 102 in the trench 150, a conductor layer 103 is deposited on the coated adhesion layer/liner 102 in the trench 150 and also on the top surface 160 of the substrate 100. A seed metal may be applied first to grow the conductor layer 103. Examples of the conductor layer 103 include copper, aluminum, Ni, NiFe, Co, CoW. Note that if a magnetic film is to be plated, a magnetic seed material (metal) is desirable first (even in FIG. 2 below), and in one case, the magnetic seed may be a bilayer with copper for conductivity and then magnetic material. The conductor layer 103 is deposited on the top surface 160 of the substrate 100 so as to fill the damascene groove or wiring trace 162. Excess conductor and seed on the surface outside the groove 162 can then be removed by CMP (chemical-mechanical-polishing). Alternatively, the damascene groove 162 can be omitted from the design, and the conductor plating region restricted to the wiring traces may be formed with a photopatterned photoresist layer in which case the excess seed is removed by etching following the removal of the photoresist. Note that the conductor layer 103 is deposited so as to leave a cavity in the trench 150. The conductor layer 103 may have a thickness of 50 nm to 1000 nm on each sidewall on the bottom surface. Since there may be some reduction in thickness on the trench bottom, the deposition thickness may be chosen to achieve a minimum thickness of 25 nm on the trench bottom. As a result of deposition, the conductor layer 103 has an inner closed loop of conductor material lining the inner sidewall and an outer closed loop of conductive material lining the outer sidewall of the trench 150. The inner closed loop of the conductor layer 103 and the outer closed loop of the conductor layer 103 are connected by the bottom surface of conductor layer 103 at the bottom of the trench.

FIG. 1D illustrates depositing a second insulator 104 on top of the coated conductor layer 103 in the trench 150 and also on the top surface 160 of the substrate 100. Examples of the insulator 104 include silicon dioxide, SiN, SiCNi, polyimide, and polybenzoxazole (PBO). The insulator 104 is deposited on the top surface 160 of the substrate 100 in the elongated pattern wiring trace 162 so as to fit within the rectangular shape of the (previously deposited) oxide insulator 101, the adhesion layer/liner 102, and conductor layer 103. Note that the second insulator 104 is deposited in the trench 150 so as to leave a cavity in the trench 150. The second insulator material 104 may have a thickness of 10 nm to 1000 nm on each sidewall and on the bottom surface.

After depositing the second insulator 104 within the trench 150, a seed metal 105 is deposited on the coated insulator 104 in both the trench 150 and also on the top surface 160 of the substrate 100. Examples of the seed metal 105 copper, aluminum, Ni, NiFe, Co, and CoW. The seed metal 105 is deposited on the top surface 160 of the substrate 100. Note that the seed metal 105 is deposited in the trench 150 so as leave a cavity in the trench 150. The seed metal 105 may have a thickness of 10 nm to 1000 nm on each sidewall and on the bottom surface.

A photomask 106 is deposited on the top surface 106 as a pattern for depositing a magnetic film 107. The photomask 106 covers the entire substrate 100 (including the elongated pattern wiring trace 162) except for the trench 150. The magnetic film 107 is deposited on the coated seed metal 105 in the trench 150 and also on the top surface 160 of the substrate 100. The magnetic film 107 is magnetic material. The magnetic film 107 is deposited and/or thermally annealed within (the presence) of a vertical (perpendicular to the substrate plane) magnetic field 120 (represented by an arrow) such that the magnetic film 107 has an induced magnetic anisotropy, which means that the easy axis of the magnetic film 107 is aligned with the magnetic field and is perpendicular to the (horizontal) plane of the substrate. The magnetic material of the magnetic film 107 may be deposited by electroplating. Examples of the magnetic film 107 include NiFe, CoWP, Fe, CoFeB, etc. The magnetic film 107 is not deposited on the top surface 160 of the substrate 100 in the elongated pattern 162 or at least is removed when the photomask 106 is removed. Note that the magnetic film 107 is deposited in the trench 150 so as to leave a cavity in the trench 150. The magnetic film 107 may have a thickness of 100 nm to 3000 nm on each sidewall and on the bottom surface. If plating or deposition process limitations cause the film thickness to vary and be thinner on and near the bottom of the trench, this is undesirable. In this case, the inductor will still work albeit with smaller inductance even if the magnetic film 107 thickness is zero on the trench bottom. The magnetic film 107 has an inner closed loop of magnetic material lining the inner sidewall and an outer closed loop of magnetic material lining the outer sidewall of the trench 150. These the inner and outer closed loops of magnetic film 107 are two magnetic laminate layers currently deposited in the trench 150.

FIG. 1E illustrates removing the photomask 106. A photopatterned insulator 108 is deposited to fill in the trench 150 and as an overcoat on top of the substrate 100. Examples of the photopatterned insulator 108 may include photosensitive-polyimide (PSPI), polybenzoxazole (PBO), etc.

Two via openings 109A and 109B are opened (i.e., etched) down to the conductor layer 103 on the elongated rectangular pattern (portion) 162, such that the conductor layer 103 is exposed at two separate locations on the elongated pattern 162. The via opening 109A is on the outside of the circular trench 150 while the via opening 109B is in about the center of the circular formation made by the circular trench. The toroidal trench inductor structure 10 is complete and can be connected further by depositing wiring over the via openings 109A and 109B.

As noted above, the conductor layer 103 has the inner closed loop of conductive material lining the inner sidewall and the outer closed loop of conductive material lining the outer sidewall of the trench 150, along with the bottom surface of conductor layer 107 connecting the inner and outer loops of conductor material. Via the elongated pattern 162, the opening 109A is configured so that one polarity (e.g., positive) of a voltage source electrically connects to the outer closed loop of conductor layer 103 while the opening 109B is configured so that the opposite polarity (e.g., negative) of the voltage source electrically connects to the inner closed loop of the conductor layer 103. When the voltage source is turned on, electrical current flows from the positive side of the voltage source, into the opening 109A, through the elongated pattern 162, down the outer closed loop of conductor layer 103 in the trench 150, through the bottom conductor layer 103 on the bottom surface in the trench 150, up the inner closed loop of conductor layer 103, out the elongated pattern 162, and out the opening 109B back to the voltage source. Note that the elongated pattern wiring trace 162 has a first exterior conductor connection 164A that connects (electrically) to the conductor layer 103 at the inside wall (i.e., the inner closed loop of the conductor layer 103) of the trench 150. Also, the elongated pattern wiring trace 162 has a second exterior conductor connection 164B that separately (electrically) connects to the conductor layer 103 formed on an outside wall of the trench 150.

According to another embodiment, FIGS. 2A, 2B, 2C, 2D, 2E, and 2F (generally referred to as FIG. 2) illustrate a schematic to fabricate an embedded toroidal trench inductor structure 20. For the toroidal trench inductor structure 20, FIGS. 2A through 2F illustrate cross-sectional views on the left and corresponding top views on the right.

FIG. 2A illustrates forming two through silicon vias (TSVs) 201A and 201B etched into a substrate 200 as understood by one skilled in the art. The substrate 200 (or 100 in FIG. 1) may be a silicon wafer. Other substrates may include glasses, $SiO_2$, polymers (such as polymide, SiC, tungsten carbide, titanium carbide, and N58), and aluminum oxide. The TSVs 201A and 201B are vertical electrical connections also referred to as vertical interconnect vias. The TSVs 201A and 201B are filled with conductor material 26 surrounded by insulating material 28. When the substrate is not silicon, the through silicon vias (TSVs) can be replaced with other through-substrate-via structures, as the utilization of the through silicon via structure is not a requirement. An example would be the copper filled vias used with glass substrates.

Back end of line (BEOL) wiring 202 is deposited on top of the substrate 200 including the TSVs 201A and 201B. The BEOL wiring 202 may be metal wiring such as copper, aluminum, gold, etc. An optional handler 203 is attached to the top of the substrate 200 including the BEOL wiring 202. The handler 203 is an additional substrate attached temporarily to the wafer with an adhesive to give structural support during processing of a thinned wafer. If the thinned wafer thickness is sufficient for mechanical stability during processing it may not be necessary. Handlers are most commonly silicon-thermal-expansion-matched borosilicate glass or silicon.

FIG. 2B shows that that the substrate 200 is flipped over and the substrate 200 (wafer) is thinned, e.g., by polishing, to expose the TSVs 201A and 201B. A circular trench 204 (as discussed above) is etched into the substrate 200 to form a ring. The exposed TSV 201A is outside (i.e., to the exterior) of the trench 204. The circular trench 204 encircles the TSV 201B. Since the substrate (wafer) 200 has been flipped over, the previous bottom side will now be referred to as the top side, such that the handler 203 is now on the bottom side.

Figure 2C:
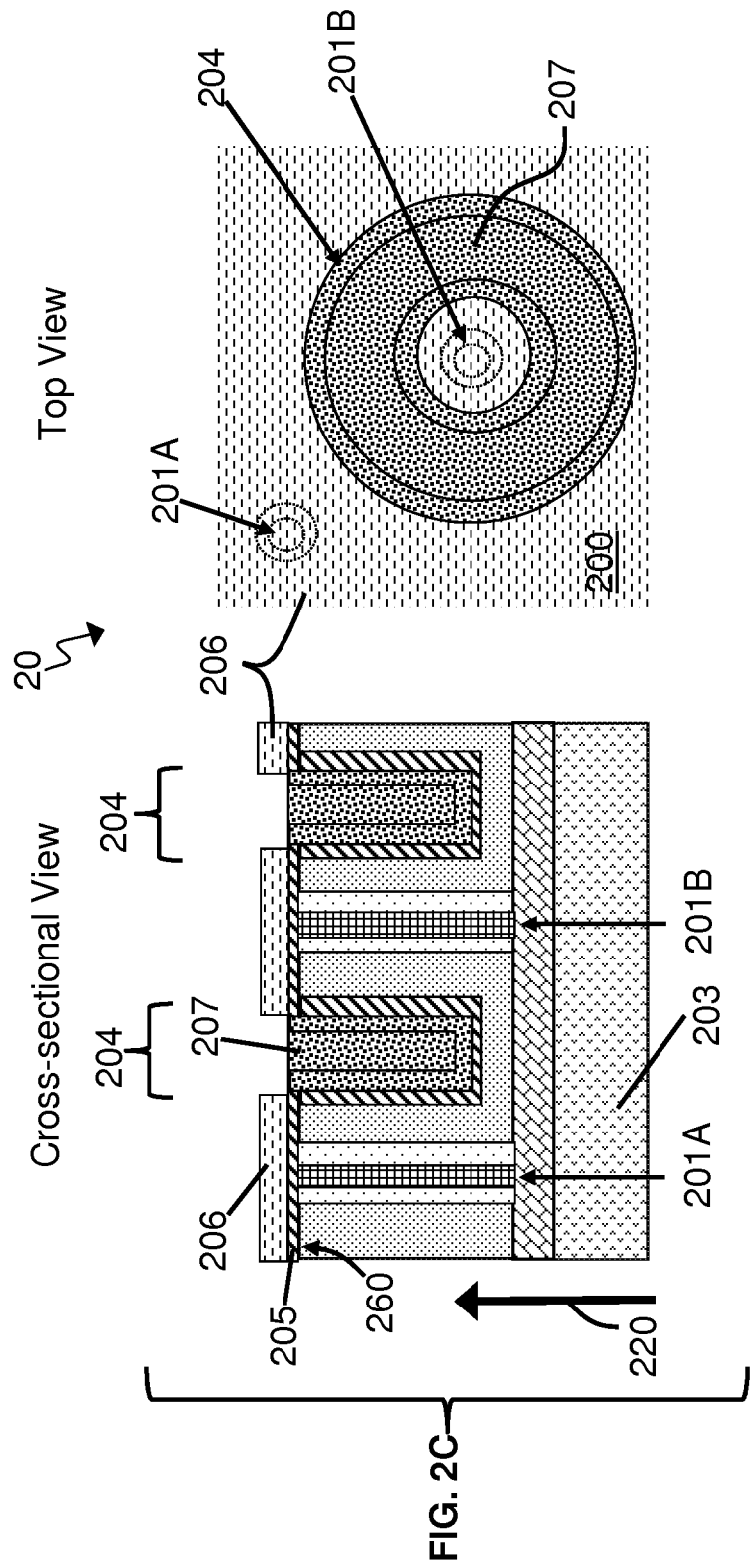

FIG. 2C illustrates depositing a blanket deposit of seed 205 in the trench 204. The sidewalls and bottom surface of the trench 204 are coated with the seed 205. The seed 205 is also deposited on a top surface 260 of the substrate 200. Note that the seed 205 is deposited in the trench 204 so as to leave a cavity in the trench 204. Examples of the seed 205 include Ti/TiN, TaTaN, Cu, Ni, NiFe, Co, CoW, and/or several of these materials deposited in sequence or other conducting materials. The seed 205 material may have a thickness of 10 to 1000 nm on each sidewall and on the bottom surface. Some reduction in thickness on the trench bottom due to process limitations can be tolerated as long as the film is continuous.

Additionally, photomask 206 is deposited and patterned on the substrate 200 in FIG. 2C. The photomask 206 covers the entire substrate 200 except for the trench 204. A (first) magnetic film 207 is deposited on (and/or grown from) the seed 205 in the trench 204. The magnetic film 207 is magnetic material. The magnetic film 207 is deposited and/or thermally annealed within (the presence) of a magnetic field 220 (represented by an arrow) such that the magnetic film 207 has an magnetic anisotropy or "easy axis" of the magnetic film 207 that is perpendicular to the substrate plane. The magnetic material of the magnetic film 207 may be deposited by electroplating. Examples of the magnetic film 207 include NiFe, CoWP, Fe, CoFeB, etc. The magnetic film 207 is not deposited on the top surface 260 of the substrate 200 except as desired to allow for alignment tolerances, or in the case when multiple concentric trenches are used, the magnetic material can be continuous between trenches. Note that the magnetic film 207 is deposited in the trench 204 so as to leave a cavity in the trench 204. The magnetic film 207 may have a thickness of 100 to 3000 nm on each sidewall and on the bottom surface. If plating or deposition process limitations cause the film thickness to vary and be thinner on and near the bottom of the trench, this is undesirable. In this case, the inductor will still work albeit with smaller inductance even if the magnetic film thickness is zero on the trench bottom. The magnetic film 207 has an inner closed loop of magnetic material lining the inner sidewall and an outer closed loop of magnetic material lining the outer sidewall of the trench 204.

In an alternate method, the magnetic film 207 is not a single magnetic layer but instead is formed as a coupled magnetic multilayer where the a first magnetic layer of half the intended thickness is deposited, then a nonmagnetic conductor such as NiP or Cu is deposited to a thickness between 10 nm and 1000 nm, and a second magnetic film making up the remaining magnetic material is deposited. An example is the NiFe/NiP/NiFe coupled magnetic film where the plating conditions are changed during electroplating to alter the material composition. Coupled magnetic films have improved magnetic domain properties as known to those skilled in the art.

Figure 2D:
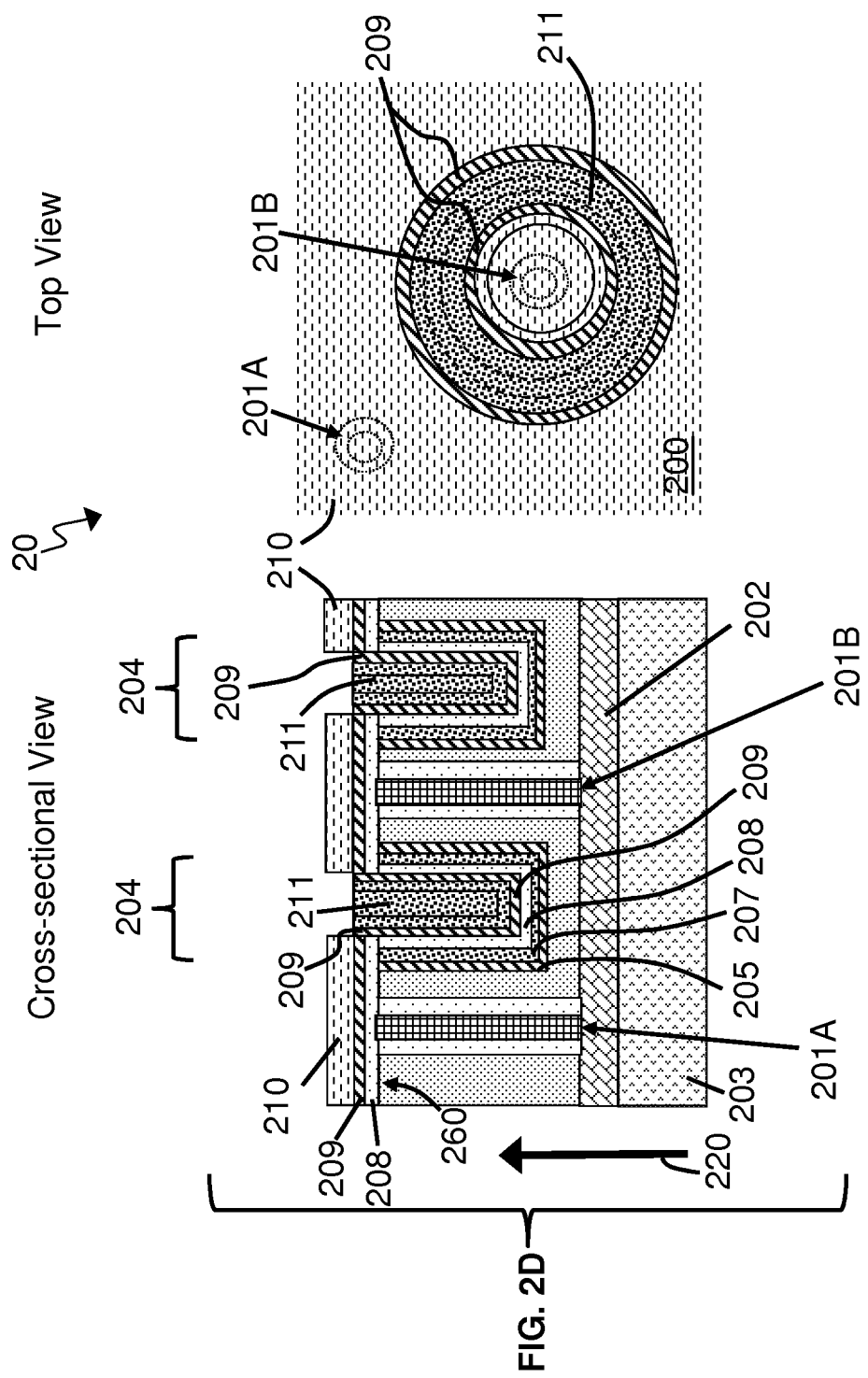

FIG. 2D illustrates that the cavity in the magnetic film 207 in the trench 204 is going to be filled. Also, the photomask 206 is etched away and the seed 205 on the top surface 260 is etched away.

Now, a blanket of oxide 208 is deposited on the top surface 260. The oxide layer 208 covers the entire the top surface 260 of the substrate 200. The oxide layer 208 is deposited on the coated magnetic film 207 in the trench 204. Note that the oxide layer 208 is deposited in the trench 204 so as to leave a cavity in the trench 204. The oxide layer 208 may have a thickness of 10 nm to 1000 nm on each sidewall and on the bottom surface.

A blanket of seed 209 is deposited on the top surface 260. The seed 209 covers the entire the top surface 260 of the substrate 200. The seed 209 is deposited on the oxide layer 208 in the trench 204. Note that the seed 209 is deposited in the trench 204 so as to leave a cavity in the trench 204. The seed 209 material may have a thickness of 10 to 1000 nm on each sidewall on the bottom surface.

Also, a photomask 210 is deposited and patterned on the top surface 260 of the substrate 200, so as to leave an opening for depositing a (second) magnetic film 211 in the trench 204. The magnetic film 211 is deposited on (and/or grown from) the coated seed 209. The magnetic film 211 is magnetic material (which may be the same magnetic material or different magnetic material than the magnetic film 207). The magnetic film 211 is deposited within (the presence) of the magnetic field 220 (represented by an arrow) such that the magnetic film 207 has an anisotropy direction perpendicular to the wafer surface. Examples of the magnetic film 211 include NiFe, CoWP, Fe, CoFeB, etc. The magnetic film 211 is not deposited on the top surface 260 of the substrate 200, and the magnetic film 211 leaves a cavity in the trench 204. The magnetic film 211 may have a thickness 100 to 3000 nm on each sidewall and on the bottom surface. If plating or deposition process limitations cause the film thickness to vary and be thinner on and near the bottom of the trench this is undesirable. The inductor will still work albeit with smaller inductance even if the magnetic film thickness is zero on the trench bottom. The magnetic film 211 also has an inner closed loop of magnetic material lining the inner sidewall and an outer closed loop of magnetic material lining the outer sidewall of the trench 204.

The process discussed in FIG. 2D may be repeated (multiple times) to build up more laminated magnetic film layers 211 in the trench 204. Currently, two magnetic film layers 207 and 211 are shown which result in four closed loops of magnetic material.

Figure 2E:
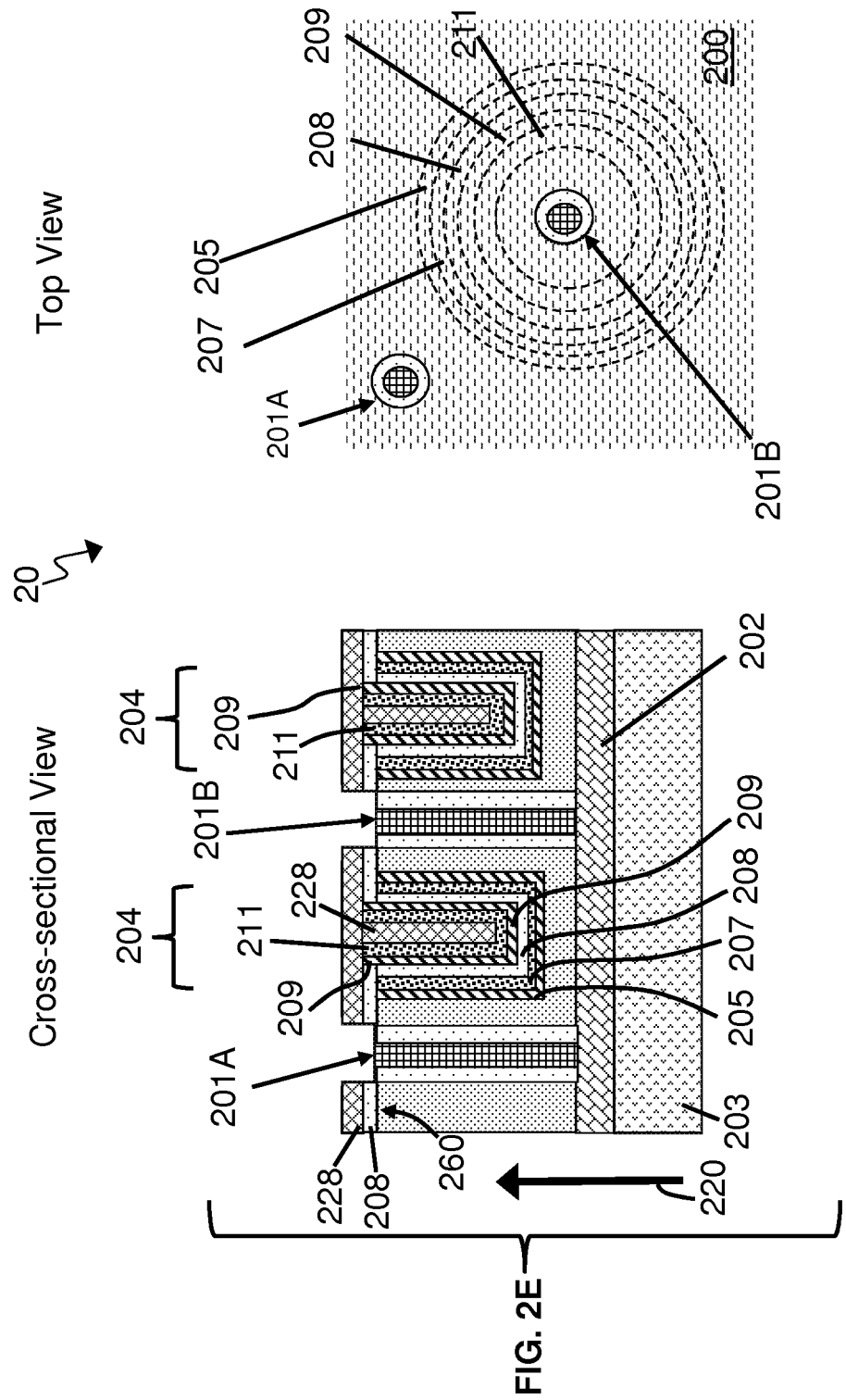

FIG. 2E illustrates that the photomask 210 is etched away and the seed 209 (only) on the top surface 260 is etched away. An insulator 228 is applied on the top surface 260 and to fill the trench 204. The insulator 228 and insulator 208 are patterned/etched to expose the inductor electrical contacts which are the TSVs 201A and 201B. Examples of the insulator 228 may include photosensitive-polyimide (PSPI), polybenzoxazole (PBO), etc. Although not shown, the process may continue by adding wiring, pads, and solder balls as understood by one skilled in the art. When complete, the handler 203 is removed.

Figure 2F:
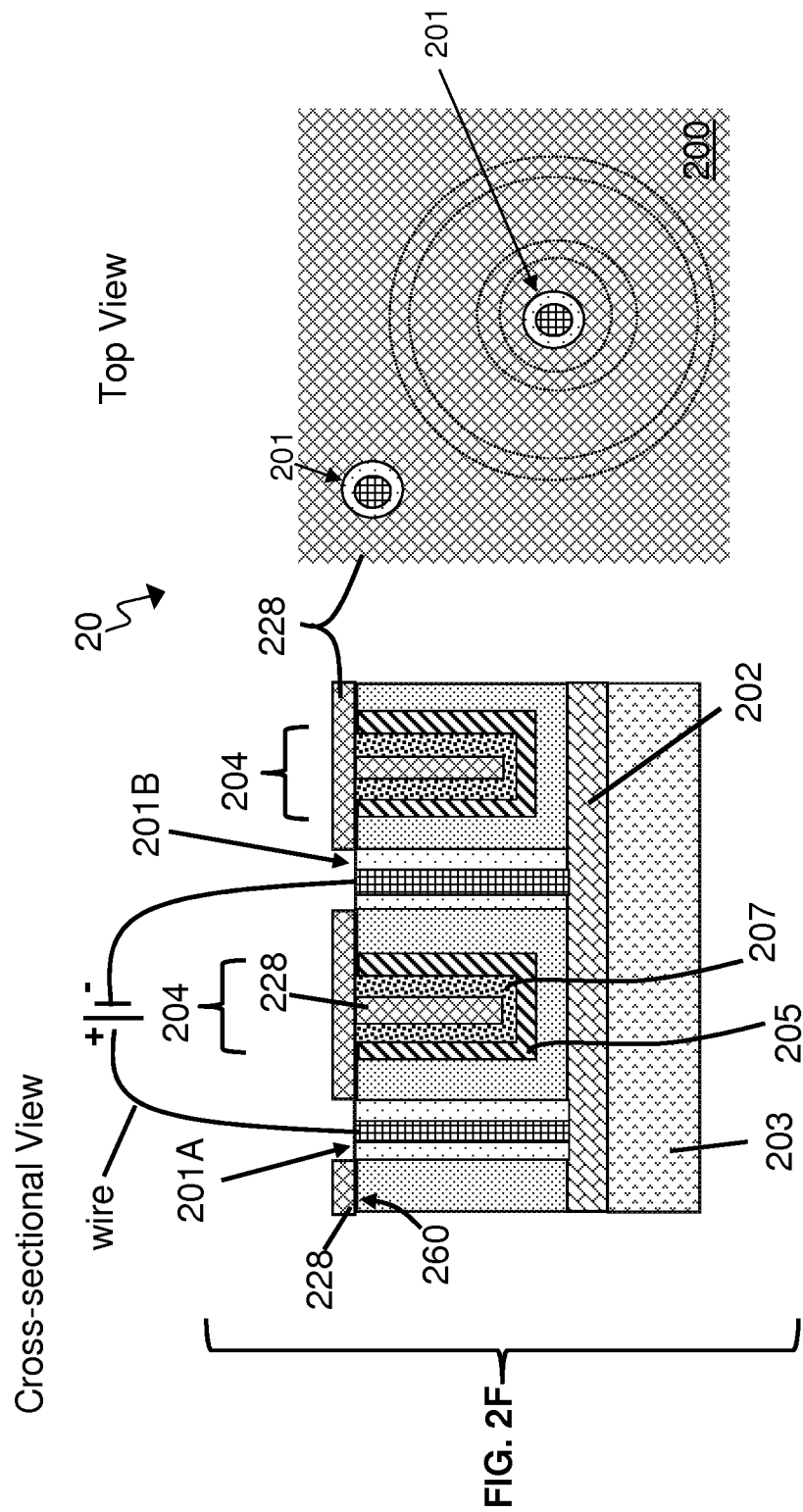

Optionally, FIG. 2D (and FIG. 2E) may be skipped in one implementation and the process may flow directly from FIG. 2C to FIG. 2F. In that case, FIG. 2F illustrates that that the deposition of the magnetic film 207 in the trench 204 leaves a cavity to be filled. Also, the photomask 206 is etched away and the seed 205 on the top surface 260 is etched away. The insulator 228 is applied on the top surface 260 and to fill the trench 204. The insulator 228 is patterned to expose the inductor electrical contacts which are the TSVs 201A and 201B. Examples of the 228 may include photosensitive-polyimide (PSPI), polybenzoxazole (PBO), etc. Although not shown, the process may continue with by adding wiring, pads, and solder balls as understood by one skilled in the art. When complete, the handler 203 is removed. The implementation in FIG. 2F only has one application/deposition of magnetic film layer 207 which results into two closed loops of magnetic material (i.e., two magnetic laminate layers).

Figure 5:
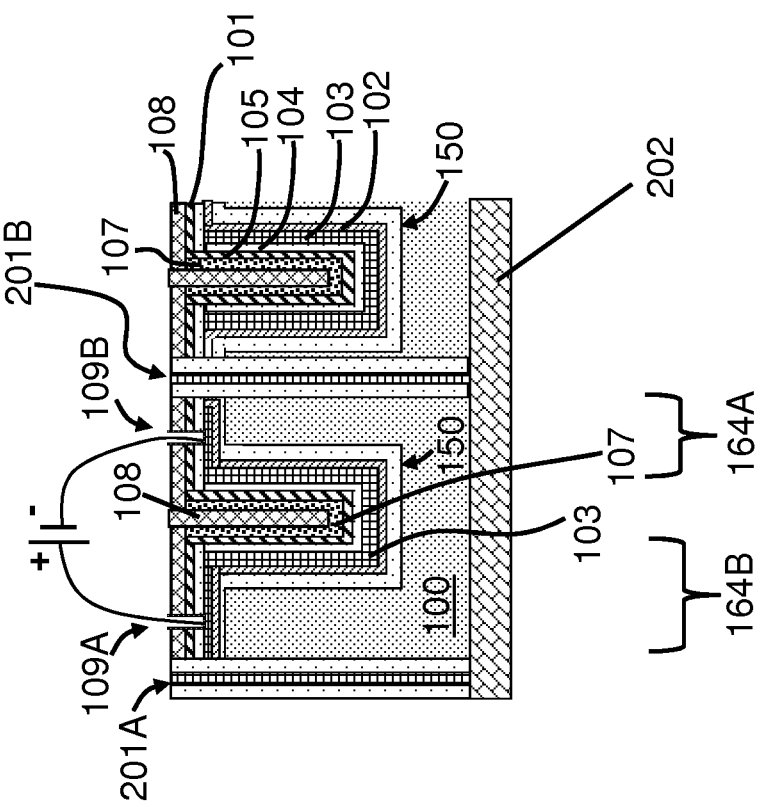
FIG. 5 illustrates a cross-sectional view that combines the embedded toroidal trench inductor structure in FIG. 1 with the though silicon vias in FIG. 2 according to an embodiment.

It is noted that the magnetic materials discussed herein may be deposited by any method such as sputtering, evaporation, CVD, electroplating, and electroless plating. Further, FIG. 5 illustrates a cross-sectional view 500 that combines the embedded toroidal trench inductor structure 10 with the TSV 201A and 201B from FIG. 2 according to an embodiment. Reference can be made to FIGS. 1 and 2 discussed above. The inductor 10 shown in FIG. 5 provides a two coil structure that is useful for coupled inductors. As discussed in FIG. 1E, the elongated pattern wiring trace 162 (via the first exterior conductor connection 164A) electrically connects to the conductor layer 103 at the inside wall (i.e., the inner closed loop of the conductor layer 103) of the trench 150. Also, the elongated pattern wiring trace 162 (via the second exterior conductor connection 164B) separately connects electrically to the conductor layer 103 formed on an outside wall of the trench 150. In addition to that (first) electrical path formed by the wiring trace 162 in FIG. 1, the through silicon vias 201A and 201B along with BEOL 202 for a separate electrical path. For example, the first through silicon via (TSV) 201A is formed outside of the circular trench 150, and the second through silicon 201B is formed near the center of the circular trench 150. An electrical connection is formed between the first and second through silicon vias (and the BEOL 202), so as to define a continuous electrical path that passes from the first through silicon via 201A to the second through silicon via 201B and passes through the inner and outer closed magnetic loops.

Figure 3A:
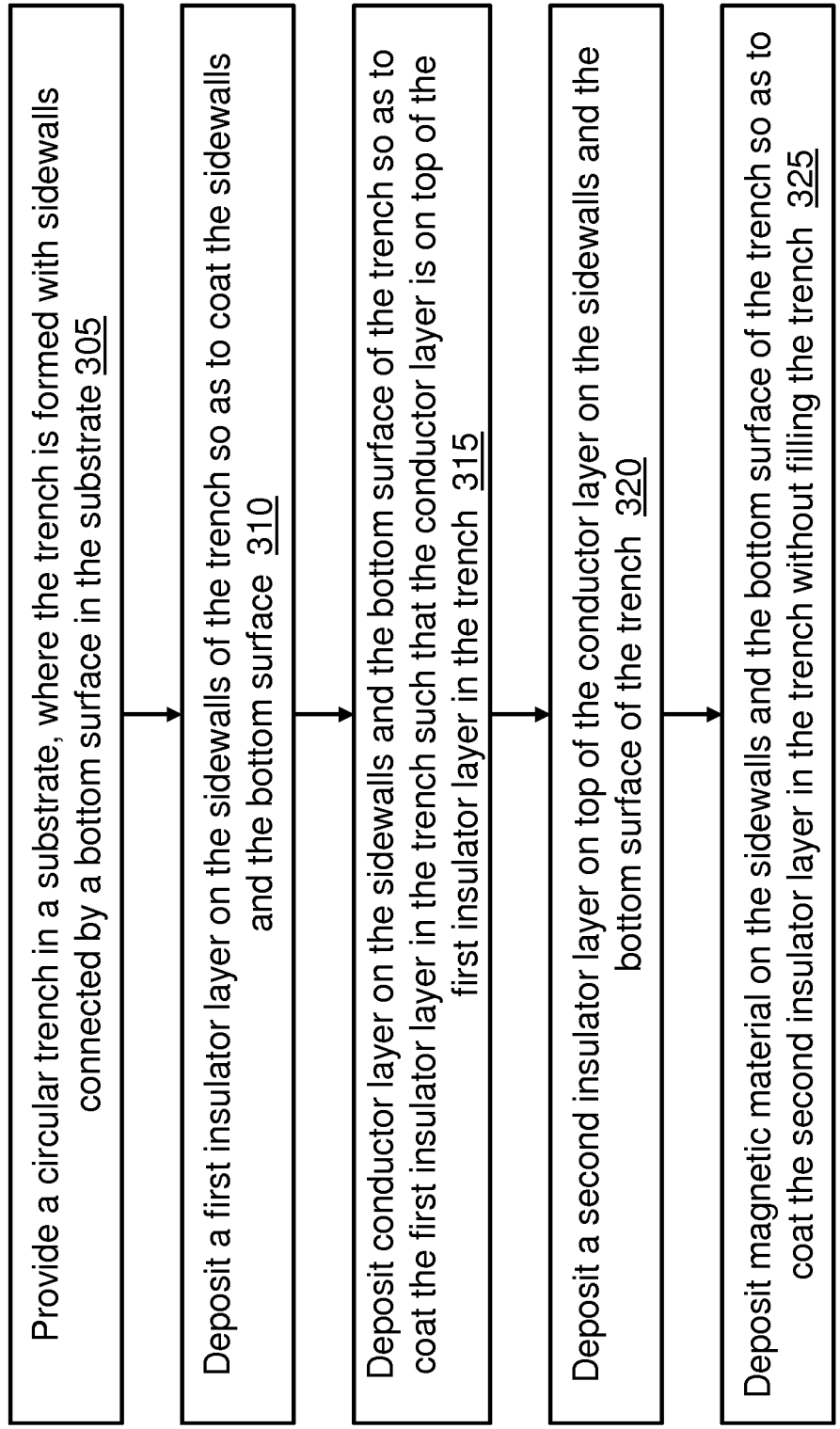

FIGS. 3A and 3B together illustrate a method 300 of integrating the inductor 10 into a semiconductor such as the substrate 100 according to an embodiment. Reference can be made to FIG. 1. The method includes providing a circular trench 150 in the substrate 100, where the trench 150 is formed with sidewalls connected by a bottom surface in the substrate 150 at block 305.

At block 310, a first insulator layer 101 is deposited on the sidewalls of the trench 150 so as to coat the sidewalls and the bottom surface. At block 315, a conductor layer 103 is deposited on the sidewalls and the bottom surface of the trench 150 so as to coat the first insulator layer 101 in the trench such that the conductor layer 103 is on top of the first insulator layer 101 in the trench.

At block 320, a second insulator layer 104 is deposited on top of the conductor layer 103 on the sidewalls and the bottom surface of the trench 150. At block 325, magnetic material 107 is deposited on the sidewalls and the bottom surface of the trench 150 so as to coat the second insulator layer 104 in the trench 150 without filling the trench. Note that the seed layer 105 is optional for electroplating.

At block 330, the conductor layer 103 deposited on the sidewalls forms an inner closed loop (i.e., the closed loop of conductor layer 103 material on the inner wall of the trench 150) and an outer closed loop (i.e., the closed loop of conductor layer 103 material on the outer wall of the trench 150) within the trench 150 connected by a bottom conductor layer 103 on the bottom surface of the trench 150, in which the inner closed loop, the outer closed loop, and the bottom conductor layer 130 form an interior conductor path inside the trench 150, such that the interior conductor path passes underneath and around sides of the magnetic material 107 in the trench 150. Note that the magnetic material 107 also has its own inner closed loop and outer closed loop easier seen when viewed from a top view.

At block 335, the interior conductor path inside the trench 150 connects to an exterior conductor path (which is the wiring trace 162 of the conductor layer 130), and the exterior conductor path separately connects to the inner loop of the conductor layer 103 (by the wiring trace 162 of the conductor layer 103 on the surface 160 encircled by the trench 150 connecting to the inner wall of the conductor layer 103 in the trench 150) and the outer loop of the conductor layer 103 (by the elongated pattern 162 of the conductor layer 103 on the surface 160 not encircled by the trench 150 connecting to the outer wall of the conductor layer 103 in the trench 150).

The exterior conductor path is a wiring trace 162 of the conductor layer 103 applied on a top surface 160 of the substrate 100. The wiring trace 162 of the conductor layer 130 is concurrently deposited on the top surface of substrate 100 (but is not in the trench 150) when depositing the conductor layer 130 inside the trench 150.

The method can continue by depositing a third insulator layer (just like insulator layer 104 but within the previously deposited magnetic material 107) on the sidewalls and the bottom surface of the trench 150 so as to coat the magnetic material 107 in the trench 150 without filling the trench 150, and then depositing a second magnetic material (just as the magnetic material 107 was previously deposited on/grown from the seed material 105) on the sidewalls and the bottom surface of the trench 150 so as to coat the third insulator layer in the trench 150 without filling the trench 150.

A magnetic field 120 aligned perpendicular to the substrate plane is applied while depositing the magnetic material 107 and/or during a subsequent thermal anneal causing the magnetic material to have an induced anisotropy perpendicular (i.e., vertical) to the plane of the substrate 100.

The method where depositing the magnetic material 107 comprises a coupled magnetic film made by electroplating NiFe as the magnetic material, subsequently electroplating NiP, and then electroplating NiFe again in a (single) continuous electroplating process of the magnetic material 107. An alternative method where the magnetic layer is a coupled magnetic film as known in the art where the magnetic film has sublayers made by depositing a magnetic material, subsequently electroplating a conducting nonmagnetic material, and then electroplating another magnetic layer. For eddy current purposes the two layers together need to be thin enough to avoid eddy current losses and then multiple pairs of these magnetic bilayers are built up separated by having an insulator in between. The nonmagnetic material would be a conductor which means one does not need to deposit a new adhesion layer and seed metal. Nonmagentic layers include Ni, Cu, NiP, Ta, Ti, and others.

FIG. 4 illustrates a method 400 of integrating an inductor 20 into a semiconductor (substrate 200) according to an embodiment. The method includes providing a circular trench 204 in the substrate 200, where the trench 204 is formed with sidewalls connected by a bottom surface in the substrate 200 such that the trench forms a circular formation in the substrate 200 at block 405.

A first through silicon via (TSV) 201A is formed outside of the circular formation at block 410, and a second through silicon via 201B is formed near a center of the circular formation at block 415. In one case, note that the first and second through silicon vias 201A and 201B may be formed prior to the trench 204.

A first magnetic material layer 207 is deposited on the sidewalls of the trench 204 so as to coat the sidewalls and the bottom surface without filling the trench 204 at block 420. The first magnetic material layer 207 deposited on the sidewalls forms a first inner closed loop and a first outer closed loop within the trench 204 at block 425.

The method includes depositing a first insulator layer 208 on the sidewalls and the bottom surface of the trench 204 so as to coat the first magnetic material layer 207 in the trench 204 such that the first insulator layer 208 is on top of the first magnetic material layer 207 in the trench 204 without filling the trench. The method includes depositing a second magnetic material layer 211 (seed layer 209 is optional) on top of the first insulator layer 208 on the sidewalls and the bottom surface of the trench 204 without filling the trench. The second magnetic material 211 is deposited on the sidewalls and the bottom surface of the trench 204 so as to coat the first insulator layer 208 in the trench 204 without filling the trench. Note that the seed material 205 may be deposited first when electroplating the second magnetic material 211.

The second magnetic material layer 211 deposited on the sidewalls forms a second inner closed loop and a second outer closed loop within the trench. A (top) second insulator 228 is deposited to fill in the trench 204 and cover the surface of the substrate 200. The method includes etching two separate openings 201A and 201B in the second insulator 228 and first insulator 208 to expose both the first through silicon via 201A and the second through silicon via 201B through the second insulator 228.

For illustration purposes, various deposition techniques are discussed below and can be utilized in embodiments, as understood by one of ordinary skill in the art. Thin film deposition is the act of applying a thin film to a surface which is any technique for depositing a thin film of material onto a substrate or onto previously deposited layers. Thin is a relative term, but most deposition techniques control layer thickness within a few tens of nanometers. Molecular beam epitaxy allows a single layer of atoms to be deposited at a time. Deposition techniques fall into two broad categories, depending on whether the process is primarily chemical or physical. Chemical vapor deposition utilizes a fluid precursor that undergoes a chemical change at a solid surface, leaving a solid layer. Chemical deposition is further categorized by the phase of the precursor and examples of chemical deposition include, but are not limited to: plating; chemical solution deposition (CSD) or chemical bath deposition (CBD); spin coating or spin casting; chemical vapor deposition (CVD); plasma enhanced CVD (PECVD); atomic layer deposition (ALD); and so forth.

Physical vapor deposition (PVD) uses mechanical, electro-mechanical, or thermodynamic means to produce a thin film of solid. Examples of physical deposition include but are not limited to: a thermal evaporator (i.e., molecular beam epitaxy); an electron beam evaporator; sputtering; pulsed laser deposition; cathodic arc physical vapor deposition (arc-PVD); electrohydrodynamic deposition (electrospray deposition); reactive PVD; and so forth.

Note that eddy currents are electric currents induced within conductors by a changing magnetic field in the conductor. These circulating eddies of current have inductance and thus induce magnetic fields. The stronger the applied magnetic field, the greater the electrical conductivity of the conductor, or the faster the field changes, then the greater the eddy currents that are developed and the greater the fields produced.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An integrated inductor in a semiconductor, the integrated inductor comprising:
    a closed loop trench in a substrate, wherein the trench is formed with sidewalls connected by a bottom surface in the substrate;
    a first insulator layer deposited on the sidewalls of the trench so as to coat the sidewalls and the bottom surface;
    a conductor layer deposited on the sidewalls and the bottom surface of the trench so as to coat the first insulator layer in the trench such that the conductor layer is on top of the first insulator layer in the trench;
    a second insulator layer deposited on top of the conductor layer on the sidewalls and the bottom surface of the trench; and
    a first magnetic layer deposited on the sidewalls and the bottom surface of the trench so as to coat the second insulator layer in the trench without filling the trench;
    wherein the first magnetic layer deposited on the sidewalls forms an inner closed magnetic loop and an outer closed magnetic loop within the trench;
    wherein an interior conductor path is formed by the conductor layer at an inside wall of the trench, such that the interior conductor path connects to a first exterior conductor connection;
    wherein a second exterior conductor connection separately connects to the conductor layer formed on an outside wall of the trench; and
    wherein an electrical path from the first exterior conductor connection to the second exterior conductor connection by way of the conductor layer in the trench forms a continuous electrical path that passes through the inner and outer closed magnetic loops.

2. The integrated inductor of claim 1, wherein the first exterior conductor connection and the second exterior conductor connection are an elongated pattern wiring trace of the conductor layer applied on a top surface of the substrate; and
    wherein the closed loop trench is a circular trench.

3. The integrated inductor of claim 2, wherein the elongated pattern wiring trace of the conductor layer is concurrently deposited on the top surface of substrate that is not in the trench when depositing the conductor layer inside the trench.

4. The integrated inductor of claim 1, further comprising a third insulator layer deposited on the sidewalls and the bottom surface of the trench so as to coat the first magnetic layer in the trench without filling the trench; and
    a second magnetic layer deposited on the sidewalls and the bottom surface of the trench so as to coat the third insulator layer in the trench without filling the trench.

5. The integrated inductor of claim 1, further comprising applying a magnetic field aligned perpendicular to a plane of the substrate while depositing the first magnetic layer thereby causing the first magnetic layer to have an anisotropy;
    wherein the anisotropy is perpendicular to the plane of the substrate.

* * * * *